US006583542B2

(12) United States Patent
Nagano et al.

(10) Patent No.: US 6,583,542 B2
(45) Date of Patent: Jun. 24, 2003

(54) DEVICE FOR MOUNTING A LIGHT SOURCE

(75) Inventors: Masamitsu Nagano, Imabari (JP); Ujiyasu Kihara, Imabari (JP)

(73) Assignee: Harison Toshiba Lighting Corporation, Imbari (JP)

( * ) Notice: Subject to any disclaimer, the term of this patent is extended or adjusted under 35 U.S.C. 154(b) by 0 days.

(21) Appl. No.: 10/083,663

(22) Filed: Feb. 27, 2002

(65) Prior Publication Data

US 2002/0117954 A1 Aug. 29, 2002

(30) Foreign Application Priority Data

Feb. 28, 2001 (JP) ....................................... 2001-053900

(51) Int. Cl.[7] ................................................... H01J 5/50

(52) U.S. Cl. ............................ 313/318.01; 313/318.07; 445/69; 439/56

(58) Field of Search ............................ 315/363; 313/49, 313/318.01, 318.07, 318.08, 318.09, 318.12, 324; 445/66, 69; 439/56

(56) References Cited

U.S. PATENT DOCUMENTS 3,659,249 A * 4/1972 Dupree ........................ 439/671
3,859,554 A * 1/1975 Preziosi et al. ............. 313/315
4,463,278 A * 7/1984 Kosmatka et al. ....... 313/318.1
4,947,082 A * 8/1990 French .................. 313/318.07
5,221,140 A * 6/1993 Oshino ........................ 362/255
5,927,998 A * 7/1999 Hino et al. .................... 439/57
6,075,318 A * 6/2000 Noll et al. .................. 313/573
6,276,812 B1 * 8/2001 Helbig et al. ............... 362/226

* cited by examiner

*Primary Examiner*—Don Wong
*Assistant Examiner*—Thuy Vinh Tran
(74) *Attorney, Agent, or Firm*—Banner & Witcoff, Ltd.

(57) ABSTRACT

A device for mounting a light source according to the present invention is composed of an electric lamp unit (21) having a baseless electric lamp (7) and a base member (8) and a mounting unit (9) having a cavity for receiving the base member of the electric lamp unit (21). The base member (8) is composed of a cylindrical body having a cavity for receiving a lower part of the baseless electric lamp (7) and supporting a pair of lead wires (7*a,* 7*b*) led out of the baseless electric lamp (7) on its outer surface. The mounting unit (9) includes a pair of conductive contact members (10*a,* 10*b*) on an inner surface of the cavity, which are connected at their lower ends to connection terminals (12*a,* 12*b*) on a printed circuit board (12). The electric lamp unit (21) is fitted into the mounting unit (9) in a removable fashion.

24 Claims, 4 Drawing Sheets

(A) (B)

(A) (B)

DEVICE FOR MOUNTING A LIGHT SOURCE

BACKGROUND OF THE INVENTION

The present invention relates to a device for mounting a light source and more particularly to a mounting device for mounting a baseless electric lamp on a substrate in a removable fashion and a method therefore.

For a meter panel of a motorcar or a display board of various electronic control devices, a light source for display and illumination is generally used. As an example of such a light source, a baseless electric lamp (a small lamp of a crush-sealing type or a bead sealing type) is used as shown in a sectional view of FIG. 8. Namely, as shown in FIG. 8, the baseless electric lamp has a light emission filament 1, which is supported by a pair of lead wires 2*a* and 2*b*. Both ends of the lead wires 2*a* and 2*b* are sealed in a glass bulb 3. The glass bulb 3 enclosing the light emission filament 1 airtightly, crushes the other ends of the lead wires 2*a* and 2*b* at a sealing part 3*a* with a pincher, and airtightly derives them below from the glass bulb. More specifically, the light emission filament is composed of a coiled tungsten wire having a diameter of several tens $\mu$m. The lead wires 2*a* and 2*b* supporting the light emission filament at their ends is composed of dumet wire or a nickel-coated dumet wire with a diameter of about 0.2 to 0.5 mm. The glass bulb 3 has an outer diameter of about 2.5 to 10 mm (a thickness of about 0.3 to 0.5 mm) and a length of about 3 to 10 mm.

In place of the pincher to forcibly crush the sealing part 3*a*, the baseless electric lamp may be formed by the following method. That is, a bead glass for supporting the lead wires 2*a* and 2*b* separately is provided at the end of the glass bulb 3 and at least either one of the bead glasses or the glass bulb 3 is fused to seal the lead wires 2*a* and 2*b*.

Such a baseless electric lamp is mounted on a socket with a power supply terminal. The socket is then mounted on a printed circuit board for a motorcar meter board, for example, which functions as a display or illumination light source for the motorcar meter board.

FIG. 9 is a cross sectional view showing the baseless electric lamp, which is mounted on a printed circuit board. As shown in the drawing, the sealing part 3*a* of the baseless electric lamp is inserted into a socket 4 and the lead wires 2*a* and 2*b* are led out through a bottom 4*a* thereof to the other side thereof. The lead wires 2*a* and 2*b* led out through to the side of the bottom 4*a* are then bent respectively along an outer wall 4*b* of the socket 4. The socket 4 with the baseless electric lamp inserted is mounted on connection terminals (lands) 5*a* and 5*b* forming a part of the circuit of a circuit board 5 and is electrically connected as well as is mechanically fixed by solder 6. The lead wires 2*a* and 2*b* led out through the bottom 4*a* to the underside of the bottom 4*a* and bent along the outer wall 4*b* of the socket 4 may be guided in a grove (not shown) to form a flat surface.

As described above, the socket 4 receiving the baseless electric lamp electrically connects the electric lamp to the circuit board.

However, there is a problem in the conventional device for mounting a baseless electric lamp on a circuit board described above. Namely, there is generally a need to replace the baseless electric lamp, which is damaged or broken in the assembly course of a meter panel for a motorcar or for a display board of various electron control devices, in the course of conveying and mounting after assembled, or in the course of use after mounted. Since the baseless electric lamp is composed of thin glass bulb and the light emission filament made of a thin wire, which is easily broken with a mechanical shock, cases happen frequently where the damaged or broken baseless electric lamp must be replaced. However, in the conventional device for mounting such kind of the electric lamp, since the lead wires 2*a* and 2*b* led out through the bottom 4*a* of the socket 4 to the underside of it are soldered (6) to the lands 5*a* and 5*b* in the circuit board 5, the solder 6 must be fused using a soldering iron to remove the lead wires 2*a* and 2*b* from the lands 5*a* and 5*b*.

However, such work is not only troublesome but also is apt to damage the whole circuit board. More specifically, soldering and re-soldering at the time of replacing of the baseless electric lamp give a thermal shock on the adjacent electronic parts or generate a short-circuit due to flow of the solder to the neighboring circuit board, thereby making the whole circuit board damaged.

SUMMARY OF THE INVENTION

Taking the problem described into consideration, an object of the present invention is to provide a device and a method for mounting an baseless electric lamp, in which the lamp mounted on a substrate is easily replaced.

A device for mounting a light source according to the present invention includes an electric lamp unit composed of a baseless electric lamp and a base member, and a mounting unit having a cavity for receiving the base member of the electric lamp unit.

The baseless electric lamp comprises a light emission filament, a pair of lead wires for supporting the both ends of the filament at their heads and a glass bulb in which the light emission filament and a part of the lead wires are sealed.

The base member comprises a cylindrical body having a cavity for receiving a lower part of said baseless electric lamp and supporting the pair of lead wires led out of the baseless electric lamp on its outer surface, The mounting unit comprises a pair of conductive contact members on an inner surface of the cavity, which are connected to connection terminals on a printed circuit board at their lower ends.

The lead wires led out of the baseless electric lamp along said outer surface of said base member are made in a sliding contact with said conductive contact members when said electric lamp unit is fitted into said mounting unit.

The electric lamp unit is fitted into said mounting unit in a removable fashion.

Further, the device for mounting a light source according to the present invention includes an electric lamp unit composed of a baseless electric lamp and a base member, a mounting unit having a cavity for receiving the base member of the electric lamp unit, and a printed circuit board having a pair of connection terminals connected to a printed circuit formed on said printed circuit board.

The baseless electric lamp is composed of a light emission filament, a pair of lead wires for supporting the both ends of the filament at their heads and a glass bulb in which the light emission filament and a part of the lead wires are sealed.

The base member is composed of a cylindrical body having a cavity for receiving a lower part of said baseless electric lamp and supporting the pair of lead wires led out from the baseless electric lamp on its outer surface, The mounting unit is composed of a pair of conductive contact members on an inner surface of the cavity, which are connected to said connection terminals on the printed circuit board at their lower ends, The lead wires led out of the baseless electric lamp along the outer surface of the base member are made in a sliding contact with the conductive contact members when said electric lamp unit is fitted into the mounting unit.

The electric lamp unit is fitted into the mounting unit in a removable fashion.

A method for mounting a light source device on a circuit board having connection terminals for mounting said light source device on at least one main surface of the circuit board includes a step for fixing a mounting unit on said connection terminals, and a step for mounting an electric lamp unit composed of a baseless electric lamp and a base member on said mounting unit.

The mounting unit has a cavity for receiving the base member of the electric lamp unit.

The baseless electric lamp includes a light emission filament, a pair of lead wires for supporting the both ends of the filament at their heads and a glass bulb in which the light emission filament and a part of the lead wires are sealed.

The base member comprises a cylindrical body having a cavity for receiving a lower part of the baseless electric lamp and supporting the pair of lead wires led out of the baseless electric lamp on its outer surface, The mounting unit includes a pair of conductive contact members on an inner surface of the cavity, which are connected to connection terminals on a printed circuit board at their lower ends.

BRIEF DESCRIPTION OF THE DRAWINGS

FIGS. 1(A) and 1(B) show the structure of an electric lamp unit constituting a part of a device for mounting a light source according to the present invention, wherein FIG. 1(A) shows a cross sectional view and FIG. 1(B) shows a rear view thereof;

FIGS. 2(A) and 2(B) show the structure of amounting unit for the electric lamp unit constituting a part of the device for mounting a light source according to the present invention, wherein FIG. 2(A) shows a cross sectional view, and FIG. 2(B) shows a rear view thereof;

DETAILED DESCRIPTION OF THE INVENTION

An embodiment of the present invention will be described hereunder with reference to the accompanying drawings.

Figure 1:
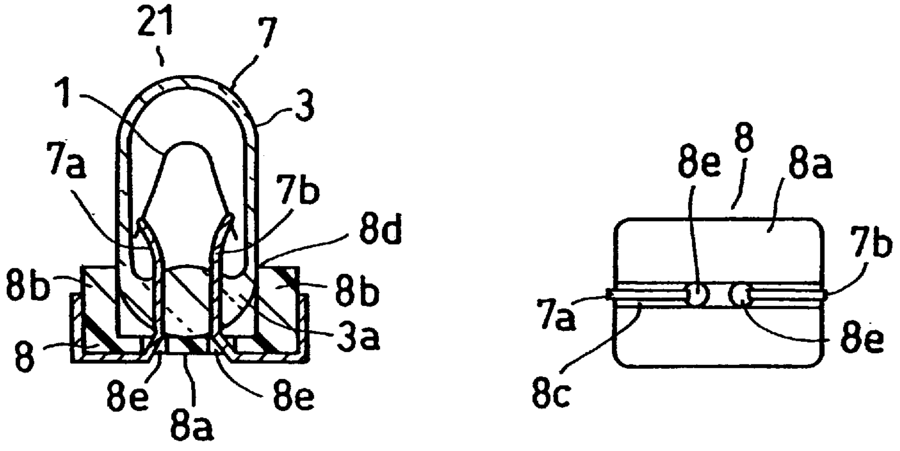

FIGS. 1(A) and 1(B) show the structure of an electric lamp unit constituting a part of a device for mounting a light source according to the present invention, wherein FIG. 1(A) shows a cross sectional view and FIG. 1(B) shows a rear view thereof.

As shown in FIG. 1(A), a baseless electric lamp 7 included in a electric lamp unit 21 is composed of a light emission filament 1, a pair of lead wires 7*a* and 7*b* for supporting the both ends of the filament 1 at their heads and a glass bulb 3 in which the light emission filament 1 and a part of the lead wires 7*a* and 7*b* are sealed. The baseless electric lamp 7 is equipped with a cylindrical base member 8 for fitting the lower part of the glass bulb 3. The cylindrical base member 8 is a molded body made of raw material such as insulating rubber or synthetic resin and is composed of a bottomed cylinder having an cavity 8*d* for fitting a lower part of the baseless electric lamp where a pair of the lead wires are led out. In a bottom wall of the cylindrical base member 8, an insertion holes 8*e* for the lead wires 7*a* and 7*b* are formed. The other ends of the lead wires 7*a* and 7*b* are led out to the other side of a bottom 8*a* via the insertion holes 8*e* of the cylindrical base member 8 and are respectively bent along an outer wall 8*b* of the base member 8. The lead wires 7*a* and 7*b* are guided in a linear grooves 8*c* formed in a lower surface of the bottom 8*a* and in the outer wall 8*b* of the base member 8. The baseless electric lamp 7 is of a bead seal type having a length of 5 mm and an outer diameter of 3 mm. An inner diameter of the cavity 8*d* of the cylindrical base member 8 is 3.2 mm. The cylindrical base member 8 has a rectangular plane as shown in FIG. 1(B). However, the shape of the plane is not limited to a rectangular in the present invention and a circular plane may be used.

As described above, the electric lamp unit 21 is composed of the baseless electric lamp 7 and the cylindrical base member 8 into which the lamp 7 is fitted.

Figure 2:
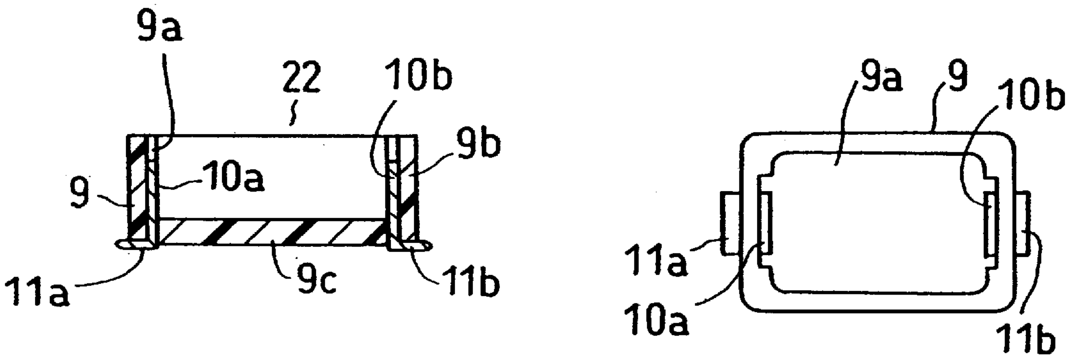

FIGS. 2(A) and 2(B) show the structure of a mounting unit for the electric lamp unit constituting a part of the device for mounting a light source according to the present invention, wherein FIG. 2(A) shows a cross sectional view, and FIG. 2(B) shows a rearview thereof. A mounting unit 22 shown in the drawing has a mounting body 9. The mounting body 9 is composed of a bottomed cylinder having a rectangular mounting cavity 9*a* for fitting the lower part of the base member 8 of the electric lamp unit in a removable fashion. The mounting unit is composed of, for example, a molded part using raw material such as insulating synthetic resin, which is excellent in mechanical strength and heat resistance. On the inner surface of a sidewall 9*b* forming a mounting cavity 9*a* of the mounting body 9, a pair of conductive contact members 10*a* and 10*b* are arranged. The conductive contact members 10*a* and 10*b* are pieces of a thin plate made of a brass, for example, and are guided in strip of recesses formed on the inner surface of the sidewall 9*b* of the mounting body 9 extending upward from the bottom of the figure. The conductive contact members 10*a* and 10*b* are arranged so as to make a sliding contact with the lead wires 7*a* and 7*b* guided in grooves 8*c* formed on the outer wall 8*b* of the cylindrical base member 8. Furthermore, the conductive contact members 10*a* and 10*b* are led out through the bottom wall of the mounting body 9 and are bent along the bottom wall 9*c*, thereby forming soldering terminals 11*a* and 11*b*.

The conductive contact members may be modified in the various manners. For example, a part of the conductive contact members may be exposed to the inner surface of the sidewall 9*b*. They may form a part of the sidewall 9*b* without a molded sidewall. Further, the conductive contact members 10*a* and 10*b* may be led out through the sidewall 9*b* instead of being led out through the bottom surface 9*c* and are bent to form a soldering terminal.

Figure 3:
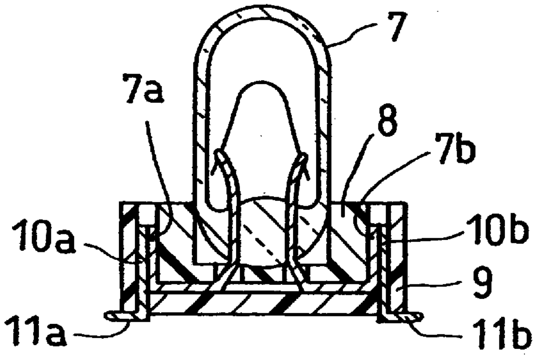
FIG. 3 is a cross sectional view showing the whole structure of the device for mounting a light source according to the present invention.

FIG. 3 shows the device for mounting a light source according to the present invention, in which the electric lamp unit 21 is fitted into the mounting unit 22. As shown in the drawing, the device removably fits the baseless electric lamp 7 into the mounting body 9. The conductive contact members 10*a* and 10*b* guided along the inner surface of the side wall 9*b* forming the mounting body 9 make a sliding contact with the lead wires 7*a* and 7*b* led out from the baseless electric lamp 7 onto the outer wall 8*b* of the cylindrical base member 8.

In the embodiment described above, the mounting unit may be modified in a manner that a pair of slits cut with a constant width are formed in the direction of a height of the side wall 9*b* of the mounting body 9, and the conductive contact members 10*a* and 10*b* are installed in the slots, so that the conductive contact members 10*a* and 10*b* constitute a part of the side wall 9*b*. Further, mounting unit may be formed by a cylinder having no bottom and is open at both sides thereof.

Figure 4:
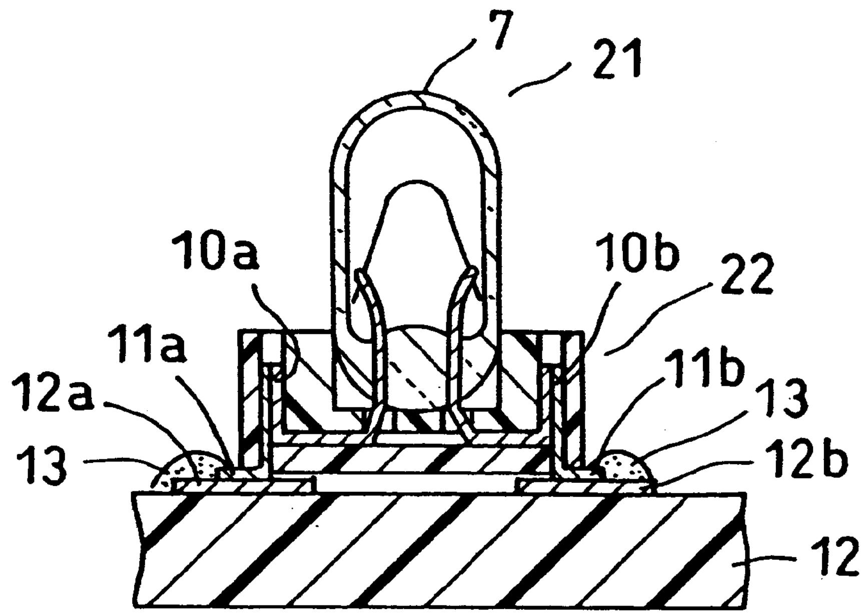
FIG. 4 is a cross sectional view showing the device for mounting a light source according to the present invention, which is mounted on a circuit board.
Figure 5:
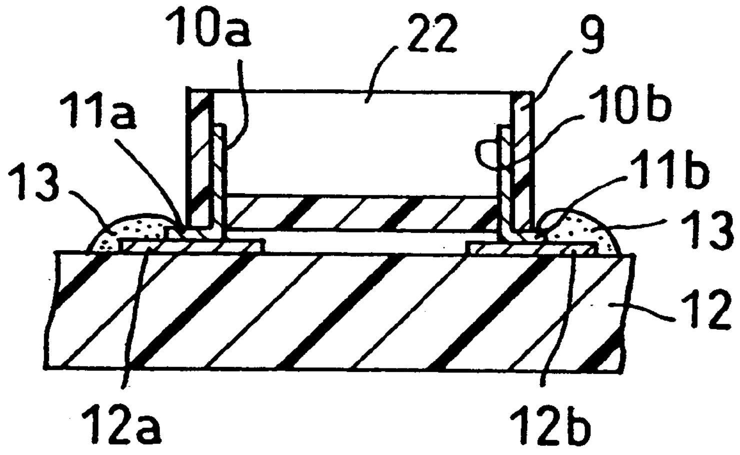
FIG. 5 is a cross sectional view showing the device for mounting a light source according to the present invention, in which the electric lamp unit is removed.

FIG. 4 is a cross sectional view showing the device for mounting a light source described above is mounted on a circuit board. FIG. 5 is a cross sectional view showing the device where the electric lamp unit is removed from that is shown in FIG. 4. The printed circuit board is used for a meter board of a car, for example, on which a required wiring circuit is printed and electronic parts are mounted. As shown in FIG. 5, the device for mounting a light source according to the present invention is mounted on a printed circuit board 12 by positioning the soldering terminals 11*a* and 11*b* of the mounting body 9 to the connection terminals (lands) 12*a* and 12*b* of the printed circuit board 12 and by carrying out soldering 13. Alternatively, the device may be mounted on the printed circuit board in a manner that only mounting unit 22 with the baseless electric lamp 7 removed, as shown in FIG. 5, is mounted on the printed circuit board 12 beforehand and then the baseless electric lamp 7 is fitted into the mounting unit 22.

According to the embodiment described, when the filament of the baseless electric lamp 7 is disconnected or the electric lamp unit 21 itself is damaged, the electric lamp unit 21 is pulled out from the mounting unit 21, which is fixed to the printed circuit board 12 and a new electric lamp unit 21 is fitted into the mounting unit 21, so that the electric lamp unit 21 can be easily replaced or repaired.

Figure 6:
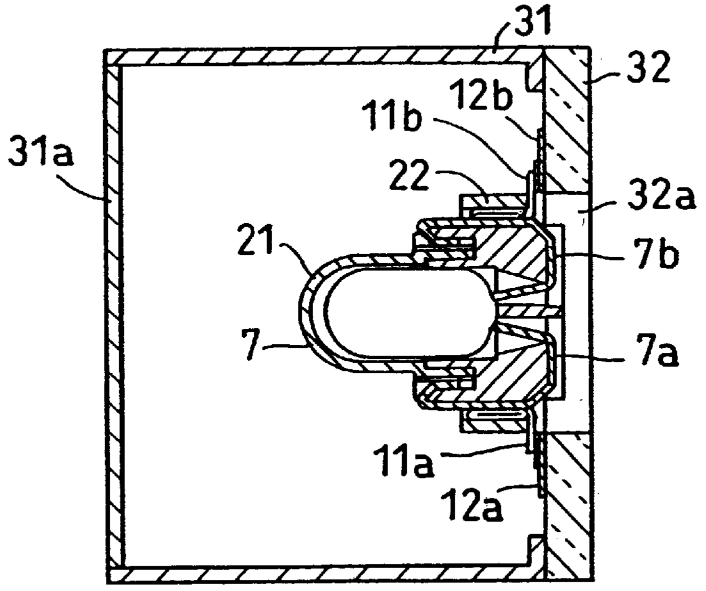
FIG. 6 is a cross sectional view of an electronic device showing another embodiment of the present invention.

FIG. 6 is a cross sectional view showing a device for mounting a light source according to another embodiment of the present invention. FIG. 6 is a cross sectional view showing an electronic device 31, in which the device for mounting a light source according to the present invention is incorporated, and in which a display or illumination unit 31*a* is installed in the front part of the electronic device 31. On the back of the electronic device 31, a printed circuit board 32 is installed. In the printed circuit board 32, a through hole 32*a* is formed, on which the mounting unit 22 for fitting the electric lamp unit 21 is fixed. Namely, the connection terminals (lands) 12*a* and 12*b* are formed on the surface of the printed circuit board 32, and the soldering terminals 11*a* and 11*b* of the mounting unit 22 are soldered on the connection terminals (lands) 12*a* and 12*b* respectively. The structure of the mounting unit 22 is almost the same as that shown in FIG. 2, except that the mounting body 9 is composed of a cylinder having no bottom wall. The structure of the electric lamp unit 21 to be fitted into the mounting unit 22 is the same as that shown in FIG. 1. Therefore, in FIG. 6, the same numerals are assigned to the same parts shown in FIGS. 4 and 5.

In the embodiment described, in which the through hole 32*a* is formed in the printed circuit board 32, the electric lamp unit 21 can be removed from the electronic device 31 via the lamp unit 21. Therefore, at the time of replacement of the electric lamp unit 21, it can be replaced without breaking down the electronic device 31, so that the electric lamp unit 21 can be easily replaced or repaired.

Figure 7:
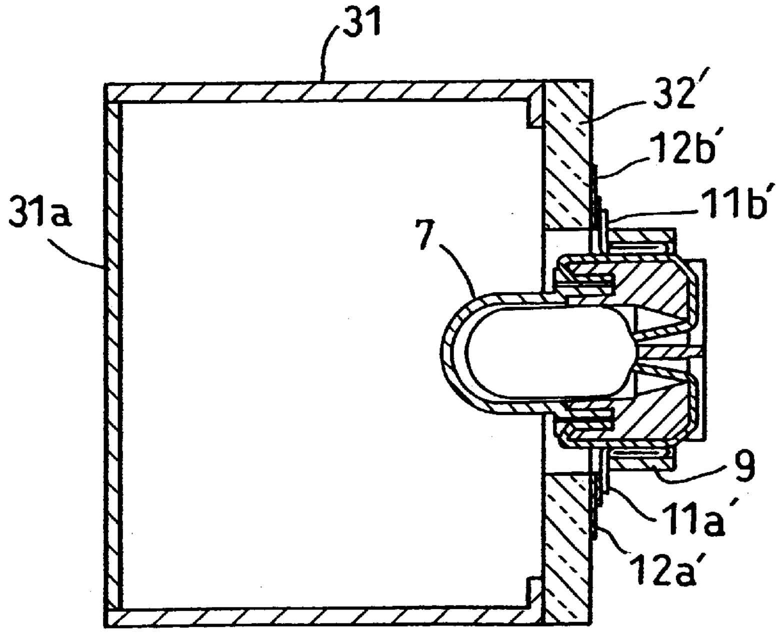
FIG. 7 is a cross sectional view of an electronic device showing other embodiment of the present invention.
Figure 8:
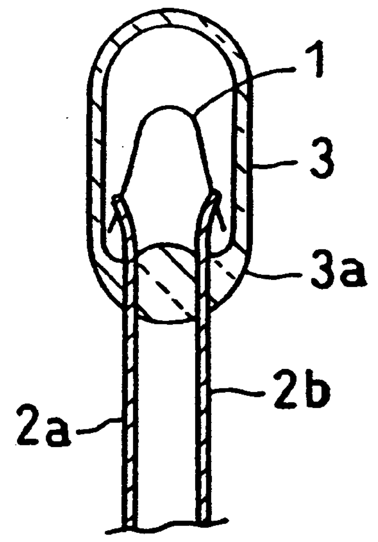
FIG. 8 is a cross sectional view showing a structure of a conventional baseless electric lamp.
Figure 9:
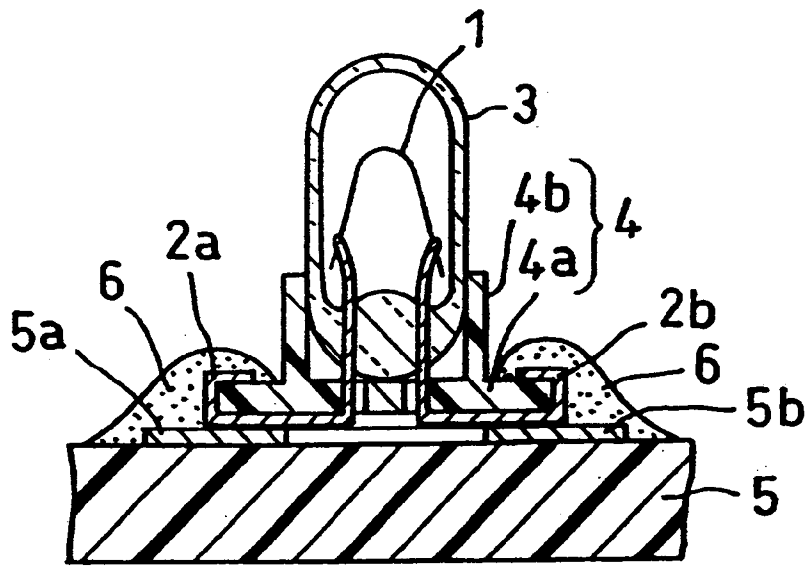
FIG. 9 is a cross sectional view showing a structure of a conventional device for mounting a light source.

FIG. 7 is a cross sectional view showing yet other embodiment, which is a modification of the embodiment shown in FIG. 6. In the drawing, connection terminals (lands) 12*a*' and 12*b*' are fixed on the outer surface of the printed circuit board 32 of the electronic device 31. The soldering terminals 11*a*' and 11*b*' of the mounting unit 22 are respectively soldered on the surface of the connection terminals 12*a*' and 12*b*'. In the embodiment, the soldering terminals 11*a*' and 11*b*' are respectively bent in a horizontal direction at upper ends of the sidewall 9*b* of the cylindrical mounting body 9 for soldering use.

In this embodiment, since the mounting unit 22 is fixed on the back of the printed circuit board 32 incorporated in the electronic device 31, the electric lamp unit 21 can be easily mounted or removed from the mounting unit 22, so that the electric lamp unit 21 can be easily replaced or repaired.

The present invention is not limited to the embodiments described and can be variously modified within a range without deviating from the scope of the present invention. For example, the baseless electric lamp, the base member or the mounting unit described can be properly modified in their structures, shapes or sizes according to the various needs for use.

According to the present invention explained above, the mounting unit functioning as an external connection terminal is separated from the electric lamp unit. The mounting unit is fixed to the connection terminals of the wiring circuit by soldering. Since the electric lamp unit is fitted into the mounting unit in a removable fashion, the electric lamp unit can be easily replaced when a fault such as disconnection of the filament of the baseless electric lamp takes place.

Further, according to the present invention, even when a fault took place in the light source device mounted on the printed circuit board, which is incorporated in electronic devices, only the light source unit is easily mounted, removed and replaced without breaking down the electronic devices, thereby enabling the repair of the light source device. Therefore, the maintenance of the electronic device can be done at a low cost.

What is claimed is:

1. A device for mounting a light source comprising:

an electric lamp unit composed of a baseless electric lamp and a base member, and a mounting unit having a cavity for receiving the base member of the electric lamp unit; wherein said baseless electric lamp comprises a light emission filament, a pair of lead wires for supporting the both ends of the filament at their heads and a glass bulb in which the light emission filament and a part of the lead wires are sealed, said base member comprises a cylindrical body having a cavity for receiving a lower part of said baseless electric lamp and supporting said pair of lead wires led out of the baseless electric lamp on its outer surface, said mounting unit comprises a pair of conductive contact members on an inner surface of said cavity, which are connected to connection terminals on a printed circuit board at their lower ends, said lead wires led out of said baseless electric lamp along said outer surface of said base member are made in a sliding contact with said conductive contact members when said electric lamp unit is fitted into said mounting unit, and said electric lamp unit is fitted into said mounting unit in a removable fashion.

2. A device for mounting a light source claimed in claim 1, wherein said base member is made of a cylinder having a bottom for forming said cavity.

3. A device for mounting a light source claimed in claim 2, wherein said base member has an insertion hole formed in a bottom of said base member, through which said lead wires from said baseless electric lamp are led out along said outer surface of said base member.

4. A device for mounting a light source claimed in claim 3, wherein said base member has a linear groove formed in said bottom and outer surface of said base member for guiding said lead wires from said baseless electric lamp.

5. A device for mounting a light source claimed in claim 1, wherein said mounting unit is made of a cylinder having a bottom to form a cavity for receiving said base member of the electric lamp unit at one end.

6. A device for mounting a light source claimed in claim 5, wherein in an inner surface of said cavity for receiving said base member of the electric lamp unit, a pair of linear recesses are formed for guiding said conductive contact members.

7. A device for mounting a light source claimed in claim 6, wherein said conductive contact members are bent along a bottom wall of said mounting unit after passing through the bottom wall, forming soldering terminals.

8. A device for mounting a light source claimed in claim 1, wherein said mounting unit is composed of a cylinder having openings at both ends.

9. A device for mounting a light source claimed in claim 8, wherein in an inner wall of said mounting unit body, linear recesses for guiding said conductive contact members are formed.

10. A device for mounting a light source claimed in claim 9, wherein said conductive contact members are bent substantially in a right angle at a lower end portion of said mounting unit to provide soldering terminals.

11. A device for mounting a light source claimed in claim 9, wherein said conductive contact members are bent substantially in a right angle at an upper end portion of said mounting unit body to provide soldering terminals.

12. A device for mounting a light source comprising:

an electric lamp unit composed of a baseless electric lamp and a base member, a mounting unit having a cavity for receiving the base member of the electric lamp unit, and a printed circuit board having a pair of connection terminals connected to a printed circuit formed on said printed circuit board; wherein said baseless electric lamp comprises a light emission filament, a pair of lead wires for supporting the both ends of the filament at their heads and a glass bulb in which the light emission filament and a part of the lead wires are sealed, said base member comprises a cylindrical body having a cavity for receiving a lower part of said baseless electric lamp and supporting said pair of lead wires led out the baseless electric lamp on its outer surface, said mounting unit comprises a pair of conductive contact members on an inner surface of said cavity, which are connected to said connection terminals on said printed circuit board at their lower ends, said lead wires led out of said baseless electric lamp along said outer surface of said base member are made in a sliding contact with said conductive contact members when said electric lamp unit is fitted into said mounting unit, and said electric lamp unit is fitted into said mounting unit in a removable fashion.

13. A device for mounting a light source claimed in claim 12, wherein a through hole is provided in said circuit board, through which said electric lamp unit can be fitted into or removed from said mounting unit with sliding contact there between.

14. A device for mounting a light source claimed in claim 13, wherein said base is composed of a cylinder having a bottom to form said cavity with an opening at one end thereof.

15. A device for mounting a light source claimed in claim 14, wherein a pair of through holes through which said lead wires of the glass bulb are inserted is formed in a bottom of said base.

16. A device for mounting a light source claimed in claim 15, wherein said base has a linear groove formed in said bottom and in outer surface of said base member for guiding said lead wires of said baseless electric lamp.

17. A device for mounting a light source claimed in claim 12, wherein said mounting unit is made of a cylinder having openings at both ends.

18. A device for mounting a light source claimed in claim 17, wherein linear recesses are formed in an inner wall of said mounting unit for guiding said conductive contact members.

19. A device for mounting a light source claimed in claim 18, wherein said conductive contact members are bent substantially in a right angle at a lower end portion of said mounting unit body to provide soldering terminals.

20. A device for mounting a light source claimed in to claim 19, wherein said conductive contact members are bent substantially in a right angle at an upper end portion of said mounting unit to provide soldering terminals.

21. A method for mounting a light source device on a circuit board having connection terminals for mounting said light source device on at least one main surface of the circuit board, comprising:

a step for fixing a mounting unit on said connection terminals, and a step for mounting an electric lamp unit composed of a baseless electric lamp and a base member on said mounting unit, wherein;

said mounting unit has a cavity for receiving the base member of the electric lamp unit, said baseless electric lamp comprises a light emission filament, a pair of lead wires for supporting the both ends of the filament at their heads and a glass bulb in which the light emission filament and a part of the lead wires are sealed, said base member comprises a cylindrical body having a cavity for receiving a lower part of said baseless electric lamp and supporting said pair of lead wires led out of the baseless electric lamp on its outer surface, said mounting unit includes a pair of conductive contact members on an inner surface of said cavity, which are connected to connection terminals on a printed circuit board at their lower ends.

22. A method for mounting a light source device on a circuit board having connection terminals for mounting said light source device on at least one main surface of the circuit board, comprising:

a step for mounting an electric lamp unit on a mounting unit, and a step for fixing a mounting unit on said connection terminals; wherein, said mounting unit having a cavity for receiving the base member of the electric lamp units said baseless electric lamp comprises a light emission filament, a pair of lead wires for supporting the both ends of the filament at their heads and a glass bulb in which the light emission filament and a part of the lead wires are sealed, said base member comprises a cylindrical body having a cavity for receiving a lower part of said baseless electric lamp and supporting said pair of lead wires led out of the baseless electric lamp on its outer surface, said mounting unit includes a pair of conductive contact members on an inner surface of said cavity, which are connected to connection terminals on a printed circuit board at their lower ends.

23. A method for mounting a light source claimed in claim 22, wherein a through hole is provided in said circuit board, through which said electric lamp unit can be fitted into or removed from said mounting unit with sliding contact there between.

24. A method for mounting a light source claimed in claim 21, wherein a through hole is provided in said circuit board, through which said electric lamp unit can be fitted into or removed from said mounting unit with sliding contact there between.

* * * * *

UNITED STATES PATENT AND TRADEMARK OFFICE
CERTIFICATE OF CORRECTION

PATENT NO. : 6,583,542 B2
DATED : June 24, 2003
INVENTOR(S) : Masamitsu Nagano et al.

It is certified that error appears in the above-identified patent and that said Letters Patent is hereby corrected as shown below:

Title page,
Item [73], Assignee, "Imbari" has been replaced with -- Imabari --.

Signed and Sealed this

Thirteenth Day of April, 2004

JON W. DUDAS
*Acting Director of the United States Patent and Trademark Office*